(12) United States Patent
Kim et al.

(10) Patent No.: US 9,911,519 B2
(45) Date of Patent: Mar. 6, 2018

(54) PASTE FOR CONTACTS AND SOLAR CELL USING THE SAME

(75) Inventors: Sang Gon Kim, Seoul (KR); In Jae Lee, Seoul (KR); Soon Gil Kim, Seoul (KR); Jin Gyeong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 922 days.

(21) Appl. No.: 13/814,980

(22) PCT Filed: Aug. 9, 2011

(86) PCT No.: PCT/KR2011/005781
§ 371 (c)(1),
(2), (4) Date: Feb. 8, 2013

(87) PCT Pub. No.: WO2012/020961
PCT Pub. Date: Feb. 16, 2012

(65) Prior Publication Data
US 2013/0133742 A1  May 30, 2013

(30) Foreign Application Priority Data

Aug. 10, 2010 (KR) .................. 10-2010-0077027

(51) Int. Cl.
| | |
|---|---|
| *H01L 31/00* | (2006.01) |
| *H01B 1/16* | (2006.01) |
| *C01G 3/00* | (2006.01) |
| *C01G 15/00* | (2006.01) |
| *C01G 30/02* | (2006.01) |
| *C01G 49/00* | (2006.01) |

(Continued)

(52) U.S. Cl.
CPC .............. *H01B 1/16* (2013.01); *C01G 3/00* (2013.01); *C01G 3/006* (2013.01); *C01G 15/00* (2013.01); *C01G 30/02* (2013.01); *C01G 49/0018* (2013.01); *H01B 1/023* (2013.01); *H01L 31/0224* (2013.01); *H01L 31/022425* (2013.01); *Y02E 10/50* (2013.01)

(58) Field of Classification Search
CPC .................................................. H01L 31/0224
See application file for complete search history.

(56) References Cited

U.S. PATENT DOCUMENTS

| | | | |
|---|---|---|---|
| 6,294,274 B1 * | 9/2001 | Kawazoe | ............... C03C 17/23 320/101 |
| 2006/0231803 A1 | 10/2006 | Wang et al. | |

(Continued)

FOREIGN PATENT DOCUMENTS

| | | |
|---|---|---|
| CN | 1933189 A | 3/2007 |
| KR | 10-2010-0035368 A | 4/2010 |

(Continued)

OTHER PUBLICATIONS

Translation of KR20100035368 p. 1-11.*

(Continued)

*Primary Examiner* — Shannon Gardner
(74) *Attorney, Agent, or Firm* — Saliwanchik, Lloyd & Eisenschenk

(57) ABSTRACT

Provided are a paste for contacts and a solar cell using the same. The paste for contacts includes Al powder, glass frit, inorganic binder, and P-type oxidation containing I group elements.

2 Claims, 3 Drawing Sheets

(51) Int. Cl.
  *H01B 1/02*       (2006.01)
  *H01L 31/0224*   (2006.01)

(56) References Cited

U.S. PATENT DOCUMENTS

2006/0273287 A1   12/2006   Young et al.
2009/0101190 A1   4/2009   Salami

FOREIGN PATENT DOCUMENTS

WO   WO-2009/009512 A1       1/2009
WO   WO 2010066359 A1 *      6/2010   ............. C01G 3/006

OTHER PUBLICATIONS

Sheng, et al "Oriented growth of p-type transparent conducting Ca-doped SrCu2O2 thin films by pulsed laser deposition," Semicond. Sci. Technol. 21 (2006) p. 586-590.*

Yoshiyama et al., Effects of radical oxygen O* in synthesis of Sr1—xNaxCuO2 infinite-layer thin film by reactive RF sputtering, Thin Solid Films 334(1998) 120-124.*

Sheng, S. et al. "p-type transparent conducting oxides" *Physica status solidi* (a), Jun. 2006, 203(8):1891-1900.

International Search Report in International Application No. PCT/KR2011/005781, filed Aug. 9, 2011.

Azuma, M., et al., "Superconductivity at 110 K in the infinite-layer compound (Sr1—xCax)1—yCuO2," Nature, vol. 356. Apr. 30, 1992, pp. 776-776.

Yoshiyama, N., et al, "Effects of radical oxygen O in synthesis of Sr1—xNexCuO2 infinite-layer thin film by reactive RF sputtering," Thin Solid Films. vol. 334, No. 1, Dec. 4, 1998, pp. 120-124.

Office Action dated Apr. 29, 2014 in Chinese Application 201180048960.X.

European Search Report dated Jun. 25, 2015 in European Application No. 11816577.8.

\* cited by examiner

[Fig. 1]
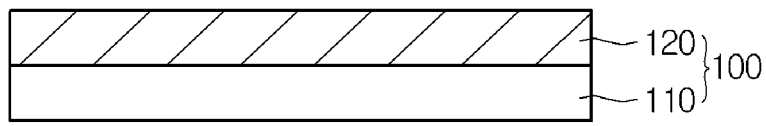
[Fig. 2]
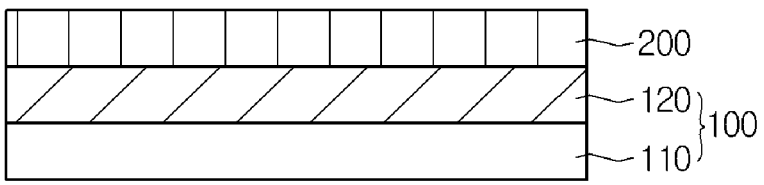
[Fig. 3]
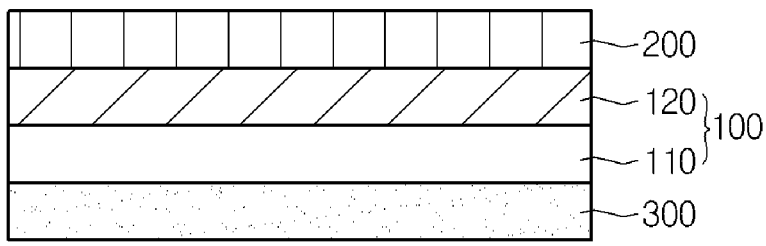
[Fig. 4]
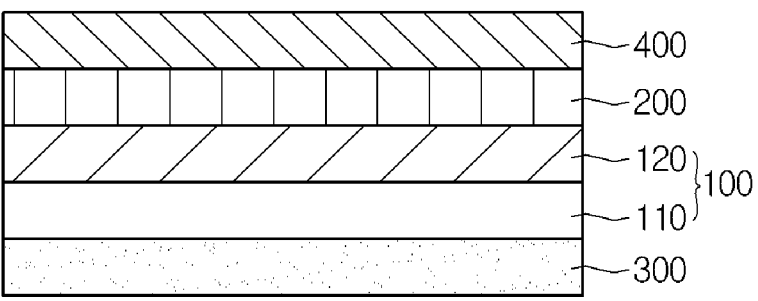
[Fig. 5]
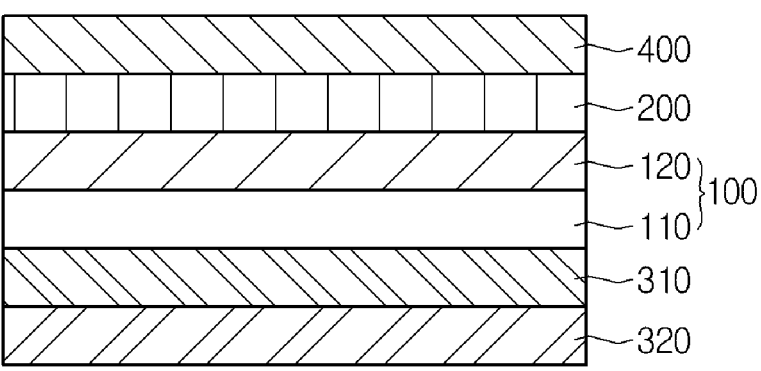

[Fig. 6]
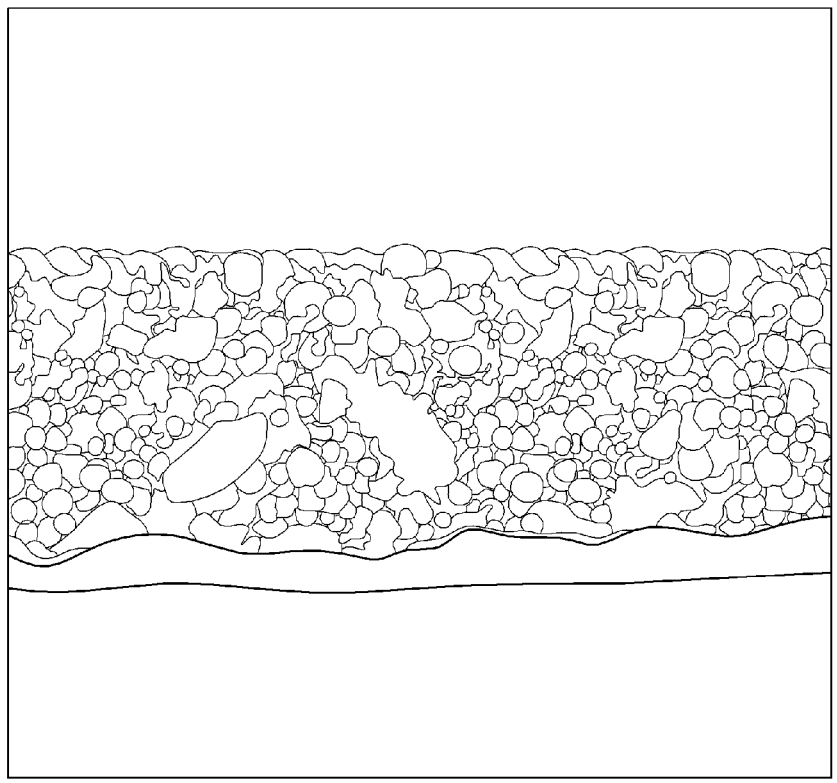
[Fig. 7]
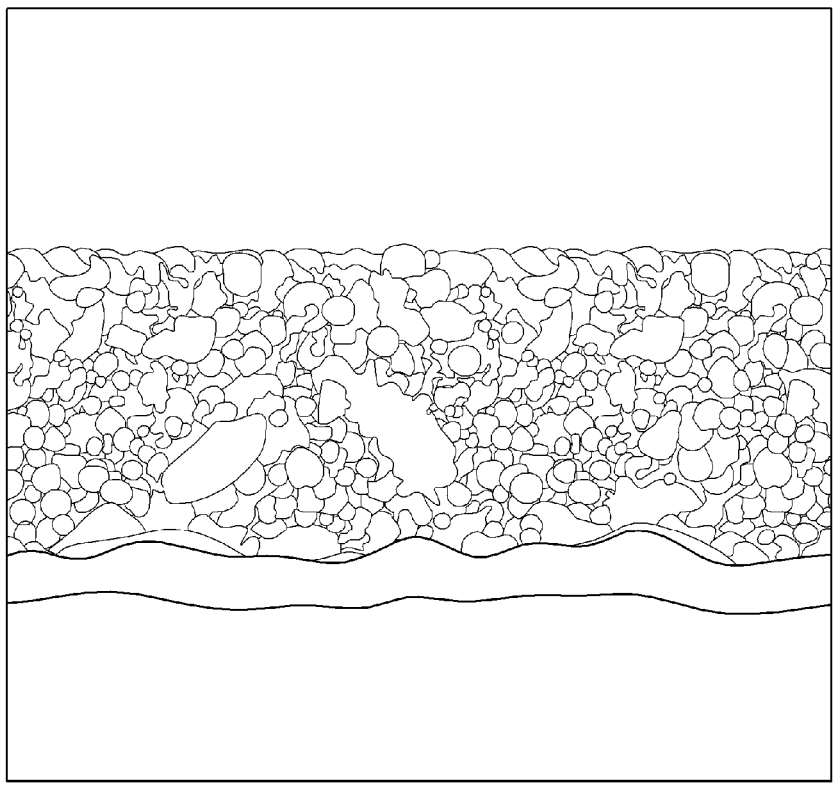

[Fig. 8]
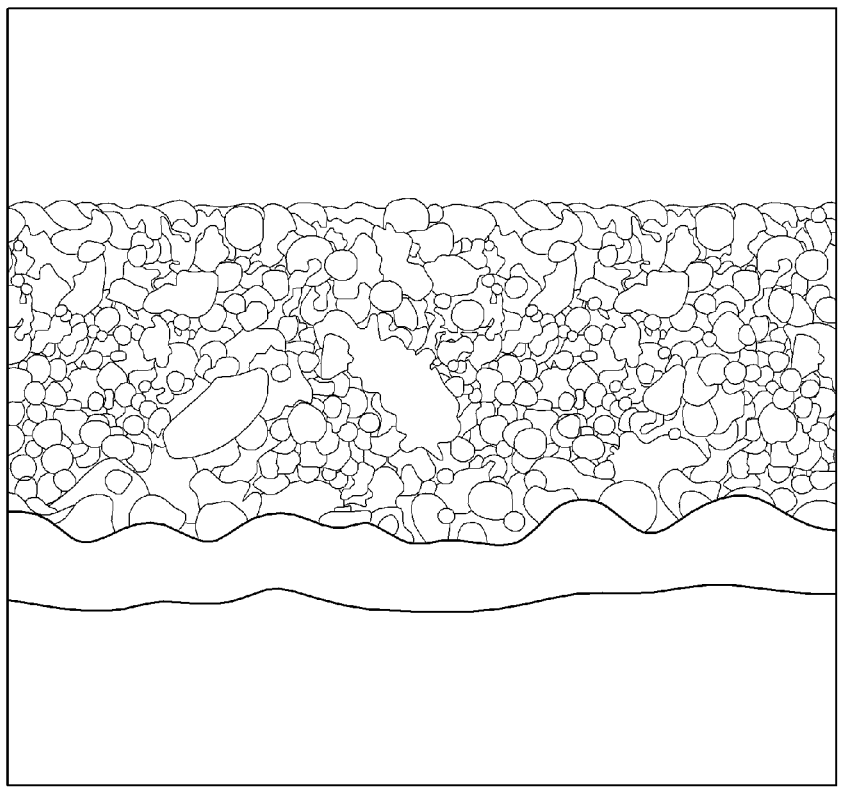
[Fig. 9]
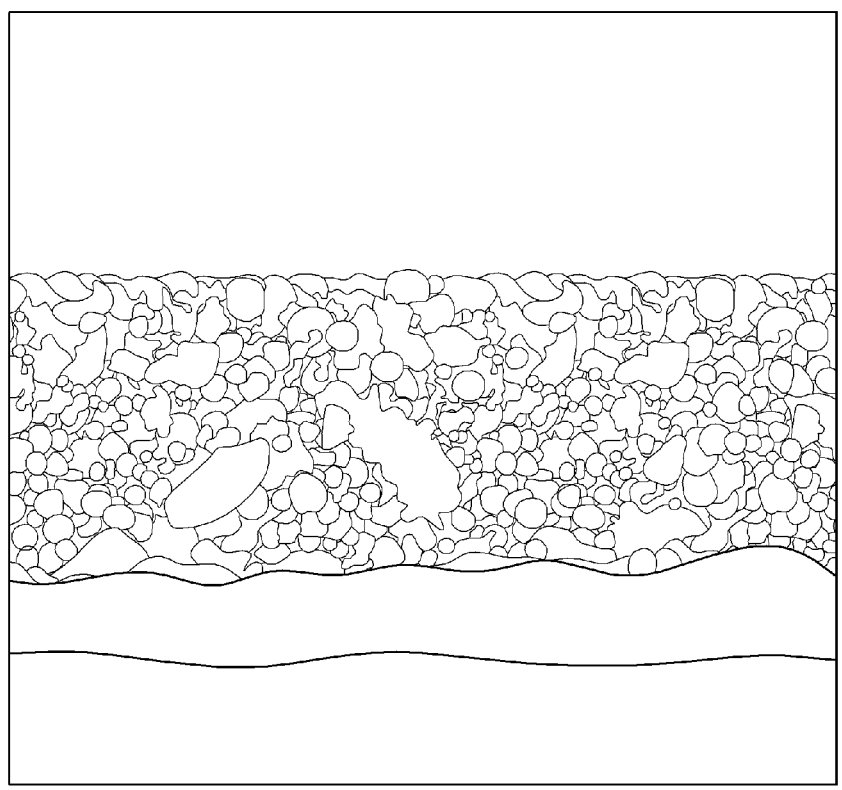

PASTE FOR CONTACTS AND SOLAR CELL USING THE SAME

CROSS-REFERENCE TO RELATED APPLICATIONS

This application is the U.S. national stage application of International Patent Application No. PCT/KR2011/005781, filed Aug. 9, 2011, which claims priority to Korean Application No. 10-2010-0077027, filed Aug. 10, 2010, the disclosures of each of which are incorporated herein by reference in their entirety.

TECHNICAL FIELD

Embodiments relates to a contact material for forming a solar cell and a method of manufacturing the same.

BACKGROUND ART

As the demands for energy increases, solar cells that convert solar energy into electric energy are being actively developed. Among the color cells, a solar cell using a silicon wafer is being widely and commercially used.

Specifically, the silicon wafer includes an PN junction in which an N$^+$ layer and a P layer adhere to each other and a back surface field (BSF) layer that is a P$^+$ layer. Here, the BSF layer may reduce a contact resistance with a rear contact to improve characteristics of the solar cell. Thus, as the BSF layer increases in thickness, the performance of the solar cell may be improved.

DISCLOSURE OF INVENTION

Technical Problem

Embodiments provide a solar cell in which a BSF layer increases in thickness to improve efficiency.

Solution to Problem

In one embodiment, a paste for contacts includes Al powder, glass frit, inorganic binder, and P-type oxidation containing I group elements.

In another embodiment, a solar cell includes: a front contact disposed on one surface of a semiconductor substrate; a back surface field (BSF) layer disposed on the other surface of the semiconductor substrate; and a rear contact disposed on the BSF layer, wherein the BSF layer or the rear contact includes a P-type oxidation containing I group elements.

In further another embodiment, a method of manufacturing a solar cell includes: forming a paste for contacts including a P-type oxidation containing I group elements on the other surface of a semiconductor substrate; forming a front contact on one surface of the semiconductor substrate; and thermally treating the paste and the front contact to form a rear contact and a BSF layer on the other surface of the semiconductor substrate at the same time.

Advantageous Effects of Invention

The paste for contacts according an embodiment may include the P-type oxidation containing the I group element. In the process of manufacturing the solar cell, when the pate including the P-type oxidation containing the I group element is thermally treated, the BSF may be increased in thickness.

That is, the I group element contained in the P-type oxidation may be diffused into the silicon substrate, or the I group element oxidation contained in the P-type oxidation may be diffused into the silicon substrate to increase the thickness of the BSF layer. Thus, according to the method of manufacturing the solar call, the solar cell including the BSF layer having the improved thickness may be provided.

Thus, in the solar cell according to the embodiments, as the BSF is increased in thickness, a leakage current may be reduced, recombination of the electrons may be prevented, and resistance may be reduced. Therefore, the short circuit of the solar cells may be prevented, and also the photoelectric conversion efficiency of the solar cells may be improved.

BRIEF DESCRIPTION OF DRAWINGS

FIGS. 1 to 5 are sectional views illustrating a process of manufacturing a solar cell according to an embodiment.

FIG. 6 is a sectional view illustrating a rear contact of a silicon solar cell according to a comparative example.

FIG. 7 is a sectional view illustrating a rear contact of a silicon solar cell according to Embodiment 3.

FIG. 8 is a sectional view illustrating a rear contact of a silicon solar cell according to Embodiment 4.

FIG. 9 is a sectional view illustrating a rear contact of a silicon solar cell according to Embodiment 5.

MODE FOR THE INVENTION

In the descriptions of embodiments, it will be understood that when a substrate, a layer, a film or an electrode is referred to as being 'on' or 'under' another substrate, layer, film or electrode, it can be directly on or under another layer or substrate, or intervening layers may also be present. Further, the reference about 'on' and 'under' each component layer will be made on the basis of drawings. In addition, the sizes of elements and the relative sizes between elements may be exaggerated for further understanding of the present disclosure.

A solar cell is a semiconductor device that converts solar energy into electric energy. The solar cell is mainly formed of a silicon material. In general, a silicon solar cell includes a silicon substrate having a P-N junction structure, an anti-reflective layer disposed on the silicon substrate to well absorb light into the solar cell, a front contact disposed on a top surface of the silicon substrate, and a BSF layer and rear contact disposed on a bottom surface of the silicon substrate.

The front contact 400 may be formed using Ag as a main contact material. The rear contact 320 may be formed using Al as a main contact material.

The rear contact 320 may be formed through following processes. First, an Al paste may be screen-printed on one surface of the silicon substrate 100 and then dried. Thereafter, the silicon substrate 100 may be burned at a temperature above a melting point of Al to form a Al—Si melt. Sequentially, in a process for cooling the Al—Si melt, an Al-doped Si epitaxial growth layer and the rear contact may be formed on one surface of the silicon substrate 10. That is, the Al paste may be converted into the rear contact and growth layer by burning and drying the Al paste.

The growth layer may be referred to as a back surface field (BSF) layer. The BSF layer may improve energy conversion efficiency of the solar cell. That is, a P$^+$ layer that is called the BSF layer may be formed on a rear surface of a PN junction-type solar cell formed of a silicon material to improve efficiency of the solar cell.

The paste for contacts according to an embodiment may include Al powder, glass frit, inorganic binder, and P-type oxidation containing I group elements. That is, the paste for contacts may include the P-type oxidation containing the I group elements to increase a thickness of the BSF layer.

The Al powder may give conductivity to the rear contact and reduce contact resistance with the silicon substrate. Thus, the rear contact may be smoothly formed.

The Al powder may have various shapes. For example, the Al powder may have a spheral shape, a plate shape, or a column shape.

The Al powder may have a size of about 1 μm to about 10 μm, but is not limited thereto. Also, the Al power may be mixed with other Al powers having a size different therefrom. For example, the Al powder may be formed by mixing Al powder having a size of about 1 μm to about 2 μm with Al powder having a size of about 5 μm to about 10 μm, but is not limited thereto.

The inorganic binder may have a softening point of about 300° to about 600°. The inorganic binder may be formed of glass frit. For example, the inorganic binder may be formed of a mixture selected from a group consisting of $SiO_2$, $Al_2O_3$, $B_2O_3$, $Bi_2O_3$, $Na_2O$, ZnO, and a combination thereof. The mixture may include a material in which two or more source materials or the whole source materials are mixed with each other.

For example, the inorganic binder may be PbO—$SiO_2$-based, PbO—$SiO_2$—$B_2O_3$-based, ZnO—$SiO_2$-based, ZnO—$B_2O_3$—$SiO_2$-based, or $Bi_2O_3$—$B_2O_3$—ZnO—$SiO_2$-based glass frit. Also, the inorganic binder may have an average particle size of about 1 μm to about 10 μm.

The content of the inorganic binder may be in a range of about 1 part by weight to about 5 parts by weight with respect to 100 parts Al powder by weight. When the content of the inorganic binder is less than about 1 part by weight, it may be difficult to realize adhesion with the silicon substrate during the burning. Also, when the content of the inorganic binder may exceed about 5 parts by weight, the adhesion with the silicon substrate may increase. However, the contact resistance between the silicon substrate and the contact may increase. Accordingly, a flow of electrons formed in the solar cell may be interrupted. In addition, conversion efficiency of the solar cell may be reduced as well as a warpage phenomenon or bead generation may occur.

The paste for contacts may further include one or two or more additive agents selected from $Tl_2O_3$, ZnO, and $Bi_2O_3$ as other additive agents. The content of the other additive agents may be in a range of about 1 part by weight to about 5 parts by weight, but is not limited thereto. The other additive agents may improve defoaming or leveling and dispersion stability and increase the adhesion with the silicon substrate.

The P-type oxidation may include an I group element. The I group element may be only an I group element or an I group oxidation. The I group element may include B, Al, Ga, In, Tl, Li, Na, K, Rb, Cs, or Fr, but is not limited thereto.

Also, the P-type oxidation may additionally include an alkaline earth metal, a transition metal, a III group element, or a V group element. Each of the alkaline earth metal, transition metal, III group element, or V group element contained in the P-type oxidation may exist as an oxidation. That is, the P-type oxidation may include an alkaline earth metal oxidation, a transition metal oxidation, a III group oxidation, or a V group oxidation. For example, the P-type oxidation may be I-III group oxidation or I-V group oxidation.

The alkaline earth metal may include Ca, Sr, or Ba, but is not limited thereto. The transition metal may include Ma, Y, La, Fe, or Cr, but is not limited thereto.

The paste for contacts according to an embodiment may be formed of a P-type oxidation expressed as following Chemical Formula 1.

$A_X B_Y O_Z$ [Chemical Formula 1]

(where, $0.5 < X \leq 1.5$, $0.5 < Y \leq 2.5$, $1.5 < Z < 4.5$, A is one selected from Cu and Ag, and B is one selected from a group consisting of B, Al, Ga, In, Ti, Mn, Y, La, Fe, Cr, Sb, Sc, Nd, and Bi)

In detail, the P-type oxidation may be expressed as $ABO_2$ or $AB_2O_4$.

The P-type oxidation expressed as Chemical Formula 1 may be manufactured by burning oxidations different from each other. For example, the P-type oxidation expressed Chemical Formula 1 may be manufactured by burning the I group oxidation and the III group oxidation under vacuum atmosphere. Also, the P-type oxidation expressed as Chemical Formula 1 may be manufactured by burning the I and V group oxidations, the I group oxidation and the transition metal oxidation, or the I group oxidation and the alkaline earth metal oxidation.

Also, the burning process may be performed at a temperature of about 870° C. to about 950° C. In more detail, the burning process may be performed at a temperature of about 950° C. When the burning process is performed at a temperature less than about 870° C., it is difficult to manufacture a single phase. When the burning process is performed at a temperature great than about 950° C., melting and overburning may occur.

Also, the burning process may be performed for a time of about 24 hours to about 96 hours. That is, a primary burning process may be performed for a time of about 72 hours, a secondary burning process may be performed for a time of about 24 hours, and a tertiary burning process may be performed for a time of about 24 hours, but are not limited thereto. When each of the primary, secondary, and tertiary burning processes is performed for a time less than about 24 hours, it may be difficult to secure a single phase. When each of the primary, secondary, and tertiary burning processes is performed for a time greater than about 24 hours, a secondary phase may occur.

The paste for contacts according to an embodiment may be formed of a P-type oxidation expressed as following Chemical formula 2.

$Sr_{1-x} M_x Cu_y O_z$ [Chemical Formula 2]

(where, $0.03 < X \leq 0.2$, $1.5 < Y \leq 2.5$, $1.5 < Z \leq 2.5$, and M is one selected from a group consisting of K, Na, and Ca) For example, the P-type oxidation may be expresses as $Sr_{1-x} M_x Cu_2 O_2$.

The P-type oxidation expressed as Chemical Formula 2 may be manufactured by simultaneously doping two kinds or more of alkaline earth metals into a Sr site. The P-type $SrCu_2O_2$ manufactured through the above-described processes may have a significantly increased doping amount as well as an improved physical property.

In more detail, the P-type oxidation expressed as Chemical Formula 2 may be manufactured by performing a process in which a Sr-based material and an alkaline metal doping material are mixed with each other and a process in which the mixture is calcined.

The Sr-contained material may include an oxidation selected from a group consisting of $SrCO_3$, and SrO. In more detail, the Sr-contained material may be $SrCO_3$.

The doped alkaline metal may be Li, Na, k, Rb, Cs, or Fr. The material used for doping K may include $K_2CO_3$ or $K_2O$. Also, the material used for doping Na may include $Na_2CO_3$ or $Na_2O$.

A gas used in the calcination process may use $N_2$ or Ar. In more detail, N2 may be used as a gas in the calcination process. The $N_2$ may be used as a purge gas for preventing oxygen from being bound.

Also, the calcination process may be performed at a temperature of about 870° C. to about 950° C. In more detail, the calcination process may be performed at a temperature of about 950° C. When the calcination process is performed at a temperature less than about 870° C., it is difficult to manufacture a single phase. When the calcination process is performed at a temperature great than about 950° C., melting and over-burning may occur.

Also, the calcination process may be performed for about 24 hours to about 96 hours. That is, a primary calcination process may be performed for about 72 hours, a secondary calcination process may be performed for about 24 hours, and a tertiary calcination process may be performed for about 24 hours, but are not limited thereto. When each of the primary, secondary, and tertiary calcination processes is performed for a time less than about 24 hours, it may be difficult to secure a single phase. When each of the primary, secondary, and tertiary calcination processes is performed for a time greater than about 24 hours, a secondary phase may occur.

The content of the P-type oxidation may be in a range of about 0.1 parts by weight to about 5 parts by weight, based on the total amount of the mixed Al paste composition, but is not limited thereto. When the content of the P-type oxidation is less than about 0.1 parts by weight, an effect in which the P-type oxidation is added to the paste may be inadequate. Thus, it may be difficult to except a function of the P-type oxidation as an additive agent for improving efficiency. On the other hand, when the content of the P-type oxidation is greater than about 5 parts by weight, the efficiency may be reduced, and also, bowing may occur.

The P-type oxidation including the I group element synthesized through the above-described processes and the Al paste may be mixed with each other, and then stirred and pulverized at the same time to manufacture an Al paste composition, in which the P-type oxidation is mixed, for contacts. The Al powder, the P-type oxidation, the inorganic binder, and the other additive agents may be pulverized and mixed using a planetary mill. Thereafter, the mixture may be put into a dispersion device using a 3-roll mill to extrude the mixed source material, thereby manufacturing the paste.

FIGS. 1 to 5 are sectional views illustrating a process of manufacturing a solar cell according to an embodiment. The manufacturing process according to the current embodiment will be described with reference to the above-described paste for contacts. In descriptions of the manufacturing process, the descriptions of the above-described paste for contacts may be applied essentially.

Referring to FIG. 1, a semiconductor substrate 100 includes a silicon substrate 110 and an N⁺ layer 120 disposed on the silicon substrate 110. That is, the N⁺ layer 120 may be formed on the silicon substrate 110 to manufacture the semiconductor layer 100. For example, the N⁺ layer 120 may be formed by injecting N-type impurities into the silicon substrate 110.

The semiconductor layer 110 may have a plate shape. For example, the semiconductor substrate 100 may be formed of silicon. The semiconductor substrate 100 may have a PN junction.

The semiconductor substrate 100 may convert incident light into electric energy. That is, the semiconductor substrate 100 may receive light from the outside to form electrons and holes.

Referring to FIG. 2, the anti-reflective layer 200 may be formed on the N⁺ layer 120. For example, a silicon nitride layer may be formed on the N⁺ layer 120, and then the silicon nitride layer may be patterned to manufacture the anti-reflective layer 200. The anti-reflective layer 200 may improve light incident efficiency into the semiconductor substrate 100. For example, the anti-reflective layer 200 may be formed of silicon nitride.

Referring to FIG. 3, a paste 300 for contacts including a P-type oxidation containing an I group element may be formed on the other surface of the silicon substrate 100. For example, the paste 300 may be formed on an under surface of the silicon substrate 100.

The paste 300 may be manufactured by synthesizing the P-type oxidation containing the I group element, adding and mixing the P-type oxidation into the Al paste, and milling the mixture of the P-type oxidation and the Al pate. In the process of manufacturing the paste for contacts, the descriptions of the above-described paste for contacts may be applied. Thus, for convenience of description, duplicated descriptions will be omitted.

The paste 300 including the P-type oxidation additive agent manufactured through the foregoing processes may be formed on the other surface of the silicon substrate 100. The paste 300 may be coated on the silicon substrate 100 using methods known to those skilled in the art. For example, the paste 300 may be printed or coated on the other surface of the silicon substrate 100 using a screen printing method, a doctor blade, or a slit coater.

Referring to FIG. 4, a front contact 400 may be formed on one surface of the semiconductor substrate 100. The front contact 400 may be formed of a conductive material. For example, the front contact 400 may be formed of one of Ag, W, Ni, Pt, and alloys thereof. The front contact 400 may be disposed on a top surface of the semiconductor substrate 100. That is, the front contact 400 may be disposed on a surface corresponding to that of the paste 300 with respect to the semiconductor substrate 100.

Referring to FIG. 5, the front contact 400 and the paste 300 may be burned and dried at the same time to form a rear contact and a BSF layer. The rear contact 320 and the BSF layer 310 may be formed on the under surface of the semiconductor layer 100 through thermal treatment. The burning process may be performed at a temperature of about 650° C. to about 950° C., but is not limited thereto.

That is, Al contained in the paste 300 as well as the P-type oxidation including the I group element may be diffused into the silicon substrate 100 to form the BSF layer 310. Thus, the BSF layer 310 may be increased in thickness.

Also, the BSF layer 310 may include the P-type oxidation containing the Al and I group element. For example, the BSF layer 310 may have a structure in which the P-type oxidation including the Al and I group element is doped.

Also, the material contained in the BSF layer 310 may include the P-type oxidation including the I group element as well as the I group element or ion materials of the I group element. In addition, the materials contained in the paste 300 may be additionally added to the BSF layer 310. For example, the BSF layer 310 may include alkaline earth metals, transition elements, III group elements, V group elements, oxidations thereof, or ion materials thereof.

Also, the P-type oxidation including the Al and I group element may remain in the rear contact 320. For example, the rear contact 320 may have a structure in which the P-type oxidation including the Al and I group element is doped.

Also, the material contained in the rear contact 320 may include the P-type oxidation including the I group element as well as the I group element or ion materials of the I group element. In addition, the materials contained in the paste 300 may be additionally added to the rear contact 320. For example, the rear contact 320 may include alkaline earth metals, transition elements, III group elements, V group elements, oxidations thereof, or ion materials thereof.

So far, the rear contact 320 and the BSF layer 310 may be formed by thermally treating the front contact 400 and the paste 300 at the same time after the front contact 400 is formed on the semiconductor substrate 100.

On the other hand, the paste 300 may be formed on the under surface of the semiconductor substrate 100, and then, only the paste 300 may be thermally treated to form the rear contact 320 and the BSF layer 310 first.

The BSF layer 310 may have a thickness of about 4 μm to about 10 μm. In more detail, the BSF layer 310 may have a thickness of about 5 μm to about 6 μm, but is not limited thereto.

As described above, the paste for contacts including the P-type oxidation containing the I group element may be printed on the rear surface of the solar cell and be dried and burned. In the drying and burning processes, $P^+$ ions generated from the mixed P-type oxidation may be moved into the BSF layer by heat energy or diffusion.

Thus, the BSF layer formed while drying the paste may have a thicker thickness. Thus, the solar cell including the uniform and thick BSF layer may be improved in conversion efficiency.

Hereinafter, the embodiments will be described in detail. However, the scope of the present disclosure is not limited to following embodiments.

Embodiment 1

Synthesis of $CuSbO_2$ Oxide $CuSbO_2$ oxide was prepared by mixing $Cu_2O$ and $Sb_2O_3$ oxides and then calcinating the resultant mixture using a burning furnace in a vacuum atmosphere. During the calcination process, a nitrogen gas ($N_2$) was used. After a primary calcination process for 72 hours, secondary and tertiary calcination processes was respectively performed for 24 hours to thereby form $CuSbO_2$ oxide.

Aluminum powder was prepared and used by mixing aluminum powder with 1 μm in size and aluminum powder with 8 μm in size at a ratio of 9:1. Further, tantalum oxide ($Tl_2O_3$) was added as another additive.

The aluminum powder, 3 parts by weight of $CuSbO_2$, 5 parts by weight of glass frit as an inorganic binder, and 1 part by weight of $Tl_2O_3$ are mixed, and thereafter the resultant mixture was milled by planetary milling. After the milled mixture was input into a dispersing unit of a 3-rolll mill, the raw material mixture was pulverized and mixed, and then extruded into a paste.

The paste was printed on the undersurface of a semiconductor substrate (e.g., silicon substrate) by screen printing. An anti-reflective layer and a front contact were printed on the top surface of the semiconductor substrate, and heat treatment was then performed at 800° C. for 30 seconds to thereby form front and rear contacts.

A Cz mono p-type silicon substrate (0.5-2 Ω) with dimension of 125×125 cm was used herein as the semiconductor substrate, and an $n^+$ emitter layer was formed to have resistance of 60 Ω/sheet.

Embodiment 2

Synthesis of $CuYO_2$ Oxide $CuYO_2$ was synthesized through the same method as that of Embodiment 1 above except that $Cu_2O$ and $Y_2O_3$ oxides were admixed. Furthermore, a manufacturing procedure of a paste for contacts and a manufacturing procedure of a solar cell were performed in the same manner as Embodiment 1 except that 3 parts by weight of $CuYO_2$ was used instead of 3 parts by weight of $CuSbO_2$.

Embodiment 3

Synthesis of $CuFeO_2$ Oxide $CuFeO_2$ was synthesized through the same method as that of Embodiment 1 above except that $Cu_2O$ and $Fe_2O_3$ oxides were admixed. Furthermore, a manufacturing procedure of a paste for contacts and a manufacturing procedure of a solar cell were performed in the same manner as Embodiment 1 except that 3 parts by weight of $CuFeO_2$ was used instead of 3 parts by weight of $CuSbO_2$.

Embodiment 4

Synthesis of $CuTlO_2$ Oxide $CuTlO_2$ was synthesized through the same method as that of Embodiment 1 above except that $Cu_2O$ and $Tl_2O_3$ oxides were admixed. Furthermore, a manufacturing procedure of a paste for contacts and a manufacturing procedure of a solar cell were performed in the same manner as Embodiment 1 except that 1 part by weight of $CuTlO_2$ was used instead of 3 parts by weight of $CuSbO_2$.

Embodiment 5

Synthesis of $Sr_{0.9}(K_{0.05}Na_{0.05})Cu_2O_2$ Oxide $Sr_{0.9}(K_{0.05}Na_{0.05})Cu_2O_2$ was synthesized through the same method as that of Embodiment 1 above except that potassium carbonate ($K_2CO_3$) and sodium carbonate ($Na_2CO_3$) which are respectively used for doping potassium and sodium into strontium carbonate ($SrCO_3$) were admixed. Furthermore, a manufacturing procedure of a paste for contacts and a manufacturing procedure of a solar cell were performed in the same manner as Embodiment 1 except that 3 parts by weight of $Sr_{0.9}(K_{0.05}Na_{0.05})Cu_2O_2$ was used instead of 3 parts by weight of $CuSbO_2$.

COMPARATIVE EXAMPLE

A manufacturing procedure of a paste for contacts and a manufacturing procedure of a solar cell were performed in the same manner as Embodiment 1 except that the paste includes aluminum powder, inorganic binder, and another additive only without addition of a p-type oxide when compared to Embodiment 1.

Sheet resistances of silicon solar cells manufactured by Embodiments 1 to 5 and Comparative Example were measured, and sections of BSF layers were observed. Results are shown in Table 1 below and accompanying drawings, i.e., FIGS. 6 to 9.

表 1

TABLE 1

|  | Comparative Example | Embodiment 1 | Embodiment 2 | Embodiment 3 | Embodiment 4 | Embodiment 5 |
|---|---|---|---|---|---|---|
| P-type additive | None | $CuSbO_2$ | $CuYO_2$ | $CuFeO_2$ | $CuTiO$ | $Sr_{0.9}(K_{0.05}Na_{0.05})Cu_2O_2$ |
| Amount of P-type additive (wt %) | 0 | 3 | 3 | 3 | 1 | 3 |

TABLE 1-continued

| | Comparative Example | Embodiment 1 | Embodiment 2 | Embodiment 3 | Embodiment 4 | Embodiment 5 |
|---|---|---|---|---|---|---|
| Sheet resistance (mΩ/sq) | 11.060 | 6.825 | 6.751 | 5.763 | 8.013 | 7.227 |
| BSF (μm) | 4.73 | 4.78 | 4.78 | 5.2 | 8.16 | 6.08 |

FIGS. 6 to 9 are photographs of sections taken after respective contact materials are printed according to foregoing Embodiments and Comparative Example 1. FIG. 6 is a sectional view illustrating a rear contact of a silicon solar cell according to a comparative example; FIG. 7 is a sectional view illustrating a rear contact of a silicon solar cell according to Embodiment 3; FIG. 8 is a sectional view illustrating a rear contact of a silicon solar cell according to Embodiment 4; and FIG. 9 is a sectional view illustrating a rear contact of a silicon solar cell according to Embodiment 5.

In the photographs, an uppermost portion, a lowermost portion, and an intermediate portion represent a paste for contact material, a wafer, and a BSF layer, respectively.

It can be confirmed that the sections shown in FIGS. 7 to 9 according to Embodiments have more uniform layers and thicker BSF layers than the section shown in FIG. 6 according to Comparative Example. This proves that solar cells according to present disclosure may exhibit higher conversion efficiency than the related art solar cell.

Features, structures, and effects described in the above embodiments are incorporated into at least one embodiment of the present disclosure, but are not limited to only one embodiment. Moreover, features, structures, and effects exemplified in one embodiment can easily be combined and modified for another embodiment by those skilled in the art. Therefore, these combinations and modifications should be construed as falling within the scope of the present disclosure.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell comprising:
a front contact disposed on one surface of a semiconductor substrate;
an anti-reflective layer on the semiconductor substrate;
a back surface field (BSF) layer disposed on the other surface of the semiconductor substrate; and
a rear contact disposed on the BSF layer;
wherein the semiconductor substrate comprises:
a silicon substrate; and
an $N^+$ layer on the silicon substrate,
wherein the $N^+$ layer is in physical contact with the anti-reflective layer,
wherein the silicon substrate is in physical contact with the BSF layer,
wherein the front contact is spaced apart from the semiconductor substrate,
wherein the BSF layer has a thickness of 4.78 μm to 5.2 μm,
wherein the BSF layer or the rear contact comprises a P-type oxidation, and
wherein the P-type oxidation is expressed as the following Chemical Formula 2:

$$Sr_{1-X}Na_XCu_YO_Z \quad \text{[Chemical Formula 2]}$$

where, $0.03 < X \le 0.2$, $1.5 < Y \le 2.5$, $1.5 < Z \le 2.5$.

2. The solar cell according to claim 1, wherein each of the BSF layer and the rear contact comprises the P-type oxidation.

* * * * *